United States Patent [19]

Dallavalle

[11] Patent Number: 4,871,927
[45] Date of Patent: Oct. 3, 1989

[54] LATCH-UP PREVENTION IN A TWO-POWER-SUPPLY CMOS INTEGRATED CIRCUIT BY MEANS OF A SINGLE INTEGRATED MOS TRANSISTOR

[75] Inventor: Carlo Dallavalle, Vimercate, Italy

[73] Assignee: SGS-Thomson Microelectronics S.p.A., Catania, Italy

[21] Appl. No.: 159,267

[22] Filed: Feb. 23, 1988

[30] Foreign Application Priority Data

Mar. 3, 1987 [IT] Italy ............................ 83609 A/87

[51] Int. Cl.$^4$ .............................................. H03K 3/01
[52] U.S. Cl. ............................ 307/296.5; 307/296.2; 307/570
[58] Field of Search ............... 307/296 R, 297, 451, 307/585, 296.5, 570, 578, 296.2

[56] References Cited

U.S. PATENT DOCUMENTS

| | | | |
|---|---|---|---|
| 4,491,746 | 1/1985 | Koike | 307/296.1 |
| 4,559,548 | 12/1985 | Iizuka et al. | 307/296 R |
| 4,647,956 | 3/1987 | Shrivastawa et al. | 307/296 R |
| 4,670,669 | 6/1987 | Cottrell et al. | 307/297 |
| 4,723,081 | 2/1988 | Akatsuka | 307/451 |

FOREIGN PATENT DOCUMENTS 52-32689  3/1977  Japan .................................. 307/296.5
60-231355 11/1985  Japan .................................. 307/296.5

OTHER PUBLICATIONS

A. H. Taber, "Circuit Technique to Help Prevent CMOS Latch-Up", IBM, vol. 26, No. 10A, Mar. 1984.
"Prevent of CMOS Circuit Latch-Up", IBM, vol. 29, No. 5, 1986.
J. Lipman "Latchup Prevention in Bulk P-Well CMOS Circuit", VLSI Design, May/Jun. 1982.

Primary Examiner—Stanley D. Miller
Assistant Examiner—Huy K. Mai
Attorney, Agent, or Firm—Bierman and Muserlian

[57] ABSTRACT

Latch-up in two supplies (+VCC and −VBB) CMOS integrated circuits is prevented by means of a single integrated protection MOS transistor, N-channel for P-Well CMOS or P-channel for N-Well CMOS, having its drain (source) connected to ground and its body region, gate and source (drain) connected to −VBB (+VCC). The desired threshold voltage and dimensions of the protection transistor do not present particular problems of implementation.

4 Claims, 1 Drawing Sheet

U.S. Patent  Oct. 3, 1989  4,871,927
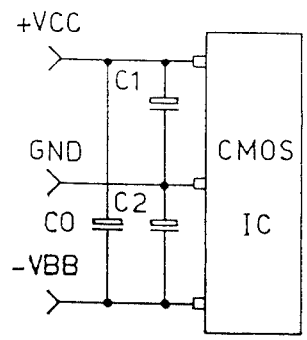
FIG. 1
(Prior Art)
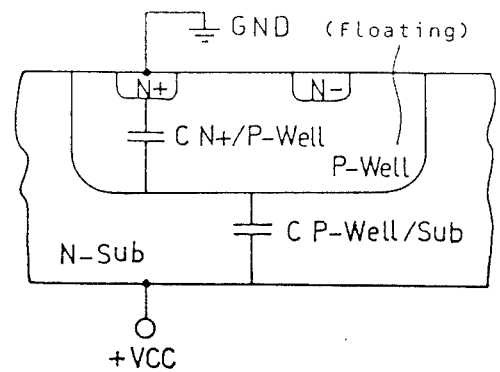
FIG. 2
(Prior Art)
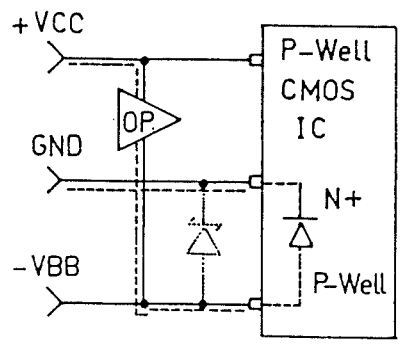
FIG. 3
(Prior Art)
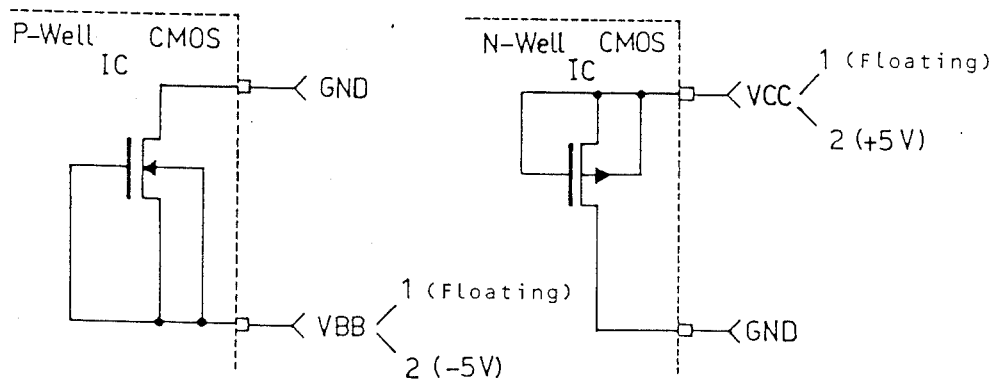
FIG. 4
FIG. 5

LATCH-UP PREVENTION IN A TWO-POWER-SUPPLY CMOS INTEGRATED CIRCUIT BY MEANS OF A SINGLE INTEGRATED MOS TRANSISTOR

BACKGROUND OF THE INVENTION

1. Field of the Invention

The present invention relates to semiconductor mono lithically integrated circuits and, more particularly, to complementary type integrated circuits comprising MISFET or, more commonly, P-channel and N-channel MOSFET structures, that is CMOS structures.

2. Description of the prior art

The commercial utilization of CMOS integrated circuits has gradually consolidated, interesting almost every kind of application of microelectronics. Today such a tech nology is commercially utilized in at least three quarters of nonbipolar integrated devices produced. One of the most sensitive aspects of CMOS technology has always been the unavoidable presence of parasitic bipolar structures which, under particular conditions, may become SCR connected, originating a regenerative phenomenon known as "latch-up" which often has a destructive consequence. The latch-up has been for years one of the main factors in delaying the commercial application of CMOS technology, being the competing technologies, namely the bipolar and single channel MOS technology, exempt from this phenomenon. Many preventive, reductive and/or protective techniques against latch-up have been developed and today the latch-up has been practicaly eliminated in CMOS integrated circuits with a single supply, which account for almost the totality of digital integrated circuits produced. On the other hand CMOS devices are widely utilized nowadays for integrated circuits performing mixed functions (analogic-digital) wherein they have practically replaced single channel MOS devices.

In this area of application, the supplies are almost always two: a positive one (VCC=+5V) and a negative one (VBB=−5V) in respect of ground (GND=0V). Moreover in this area of application, a good decoupling between digital and analogic parts of the integrated circuit as well as between different circuit sections which function within the integrated devices (e.g. transmission and reception circuit sections) is mandatory. It follows that for A/D and D/A converters and in general for analogic/digital integrated circuits, the supplies are kept "clean" by means of capacitors connectors between one supply and the other and between each supply and ground. These capacitors have necessarily relatively high values of capacitance (up to 100 micro Farads) and therefore once charged they may cause strong current peaks, i.e. they are able to supply high currents even if for extremely limited periods of time.

Such a typical circuit arrangement is shown in FIG. 1.

It is easily understood that with an increasing number of supplies, the problem of preventing latch-up becomes more severe. The probability that, as a consequence of a particular sequence of application of the supply voltages, one of the integrated circuit pins be polarized in a relatively incorrect way, thus provoking a direct biasing of the internal junctions of the integrated device (condition which may cause latch-up), increases.

For example, if the integrated device is a P-Well CMOS, when the −5V supply voltage is applied with a certain delay in respect of the +5V supply voltage, the temporary "floating" condition of the negative supply pin of the integrated circuit reflects itself as a positive biasing of the VBB terminal (pin) by virtue of a capacitance subdivision of the VCC voltage (equal to +5V), in accordance with the relation:

$$VBB = VCC \cdot \frac{CO}{CO + C2}$$

Therefore, if C2=CO; then VBB=+2,5V for the whole period of time during which to the relative pin of the integrated circuit corresponding to the VBB supply is not imposed the correct supply voltages of −5V.

Also the expedient of using a capacitor CO much greater than the capacitor C2 is not always practicable. It is also easily understood that, for an integrated circuit manufacturer it is difficult to foresee the uses which will be made of the integrated circuit itself and therefore which capacitors will be used, unless imposing stringent application specifications which are hardly acceptable by the users.

From the point of view of an integrated circuit manufacturer, a typical situation is that shown in FIG. 2, wherein the capacitance between a P-Well region and the substrate is much greater than the capacitance between an N+ diffused region and the P-Well ($C_{p\text{-}Well/sub} >> C_{N+/P\text{-}Well}$).

In such a situation, the P-Well potential will rise up to a value very close to the VCC voltage and the P-Well/N+ junction will result direct biased if within the P-Well tub there are grounded N+ diffusions. Such grounded diffusions almost certainly exist because for the designer of integrated circuits not having available N-channel MOS transistors with a source connected to ground formed in a substrate which under steady conditions must be at a VBB potential (−5V) would be a hardly tolerable restraint.

Therefore the designer of integrated circuits must protect these areas, but the protection against latch-up has a definite cost in terms of area so that this reflect itself in a certain limitation of the number of N-channel transistors with grounded source which may be economically used in designing the integrated circuit.

Shown in FIG. 3, is what may happen in a integrated circuit with two supplies when on an assembly card other components are connected to the two supplies and a retarded application of the VBB voltage in respect to the VCC voltage has provoked the direct biasing of internal junctions (diodes) P-Well/N+.

An eventual presence of an operational amplifier, as schematically shown in FIG. 3, provides a current path: VCC - operational amplifier - VBB - P-Well/N+ diode - GND; which is responsible for triggering the latch-up condition with a consequent possible destruction of the integrated circuit. In a case of this kind in fact, the current injected is relatively large even in absence of capacitors connected across the supplies.

Naturally, the above noted problems are present also in a N-Well CMOS device when the positive supply (VCC) is provided with a certain delay in respect to the negative supply voltage (VBB). In this case N-Well tubs and P+ diffusions substitute P-Well tubs and N+ diffusions, respectively, in the relative figures and in the above discussion.

A common advice still given by integrated circuit manufacturers through data sheets, is that of using a Schottky diode connected as shown in FIG. 3 by means of the phantom (dash line) figure (i.e. between VCC and GND in the case of a N-Well CMOS), or of providing a capacitor CO much greater than C2 and C1 in case disturbances by-pass capacitors are used on the supplies.

Users, on their part, build cards intended for two supplies P-Well CMOS integrated circuits, purposely having the terminals of the tracks relative to the VBB voltage projecting more than the ground terminals and, particularly, than those relative to the VCC voltage so that, upon inserting the card carrying P-Well CMOS integrated devices, the supply voltages be applied according to the following sequence: VBB=−5V, GND=0V and VCC=+5V. Upon extracting the card, the same supply voltages will be disconnected according to an inverted sequence. Obviously such a solution avoids latch-up problems only during insertions and extractions of the card. Moreover, such an expedient will cease to be useful when, soon, P-Well type as well as N-Well type CMOS integrated circuits will be utilized together on a same system card.

SUMMARY OF THE INVENTION

It is a main objective of the present invention to provide an integrated circuit comprising CMOS structures of the type utilizing two supplies which is effectively protected from latch-up without requiring for this purpose particular expedients in the external supply circuit of the integrated device.

Such an objective and other advantages are obtained, in accordance with the present invention, by forming in the integrated circuit a MOS transistor of adequate characteristics and by connecting the four terminals there of, namley the: drain, gate, source and body terminals in the way which will be specified later in the description and recited in the appended claims.

In case of P-Well CMOS devices, such a protection tran sistor will be an N-channel transistor, while in N-Well MOS devices, such a protection transistor will be a P-channel transistor.

BRIEF DESCRIPTION OF THE DRAWINGS

FIG. 1 shows a commonly adopted circuit arrangement of external by-pass capacitors across the supplies of a two supplies CMOS integrated circuit;

FIG. 2 shows schematically the critical capacative couplings of a P-Well CMOS device;

FIG. 3 shows schematically a possible situation leading to a severe latch-up condition;

FIG. 4 shows a principle circuit diagram of the anti latch-up arrangement of the present invention as applied to a P-Well CMOS integrated circuit; and FIG. 5 shows a principle circuit diagram of the anti latch-up arrangement of the present invention as applied to a N-Well CMOS integrated circuit.

FIGS. 1, 2 and 3 have already been described in relation to the discussion of the prior art.

DESCRIPTION OF THE PREFERRED EMBODIMENTS

As shown in FIG. 4 for the case of a P-Well CMOS integrated circuit, the critical condition for the triggering of a latch-up phenomenon has been identified as a supply pin VBB which, instead of being normally polarized at −5V (condition 2), is floating (condition 1).

Similarly, as shown in FIG. 5 relative to the case of an N-Well CMOS integrated circuit, the critical condition for the triggering of a latch-up phenomenon has been indicated as a supply pin VCC which, instead of being normally polarized at +5V (condition 2), is floating (condition 1).

In the following description, drafted for the case of a P-Well CMOS integrated circuit, will be indicated whereever possible or useful, the condition applicable in the case of an N-Well CMOS device, indicating this latter condition in brackets.

Upon the taking place, for any accidental reason, of the condition 1, that is when the pin or common potential node relative to the VBB supply is at a floating potential (VCC floating) and as soon as the potential of the node VBB (VCC) assumes a positive (negative) potential in respect to ground, the protection four terminals integrated N-channel (P-channel) transistor will be subject to the following condition:

$$VGS > Vth\phi_{N\text{-}ch} \text{ with } VGS = VBB \text{ floating}$$

$$(VGS < Vth\ \phi_{p\text{-}ch} \text{ with } VGS = VCC \text{ floating})$$

and it will turn-on causing the potential of the node VBB (VCC) to drop down to the relative threshold voltage $Vth\phi_N$ ($Vth\phi_P$).

In this way, by suitably dimensioning the value of the extrapolated threshold voltage of the protection transistor of the invention, it is possible to prevent direct biasing of the relevant internal junctions of the integrated circuit.

In the condition 2, that is when the supply voltage VBB (VCC) has the correct polarity, the integrated protection transistor will have a gate voltage below its threshold voltage:

$$(VGS = 0V \text{ with } Vth\phi_N > 0V)$$

$$(VGS = 0V \text{ with } Vth\phi_p < 0V)$$

Therefore, in condition 2, that is under normal operation of the integrated circuit, VBB=−5V (VCC=+5V) and the protection integrated four terminals MOS transistor will be turned-off. In order to ensure such a condition it is necessary to impose on the protection transistor the typical value of the extrapolated threshold voltage:

$$Vth\phi_N = +0.45V$$

$$(Vth\phi_P = -0.45V)$$

With such a value of extrapolated threshold of about 0.45V, in fact, under condition 1, the positive VBB potential (negative VCC potential) will discharge through the conducting protection MOS transistor until the voltage drops to about 0.45V (−0.45V), when the following condition will be satisfied:

$$VGS = Vth\phi_N$$

$$(VGS = Vth\phi_P)$$

and the protection MOS transistor will remain conducting but unable to discharge further the potential of the VBB (VCC) node. However this is sufficient to prevent direct biasing of the junctions for which a potential of about 0.6 to 0.7V (−0.6 to −0.7V) is required.

It will be necessary that the N+ (P+) source diffusion connected to ground of the integrated protection transistor of the invention be provided with appropriate guard rings against latch-up because the relative junction will be direct biased under condition 1. However this is an anti latch-up arrangements which is required by this single transistor for the entire intergrated circuit.

RANGE OF VARIATION OF THE THRESHOLD VOLTAGE OF THE PROTECTION TRANSISTOR

Being the absolute values and the variation ranges identical for integrated P-Well devices as well as for integrated N-Well devices, for simplicity's sake in the following discussion instead of using a double (bracketed) symbolism as in the preceding description, a modulus notation will be used.

An adequate reliability of the protection device object of the present invention will be ensured by a threshold potential of the protection transistor $$|Vth\phi| = \pm 100 \text{ mV}$$

In such a case, the extreme values of the range of variation will be:

$$\frac{|0.35 \text{ V}| \quad |0.45 \text{ V}| \quad |0.55 \text{ V}|}{\text{min} \quad \text{typical} \quad \text{max}}$$

The temperature dependence of the modulus $Vth\phi$ of the threshold voltage will be discussed herein below.

For a MOS transistor, the typical values of $d|Vth\phi|/dt$ are:

$$\frac{d|Vth0|}{dt} \cong \frac{2.5 \text{ mV}}{°C.}$$

It is known that such a value is further reduced when the threshold of the device is obtained, as it is preferably the case, by increasing the charge by means of ion implantation. However, for caution's sake, by applying the temperature coefficient of 2.5 mV/°C. to the field of variation of the threshold voltage $Vth\phi$, for temperature values from $-40°$ C. to $+100°$ C., the range of variation expands as it follows:

$$\frac{|160 \text{ mV}|}{\text{min } (T = 100° \text{ C.})} < |Vth\phi| < \frac{|710 \text{ mV}|}{\text{max } (T = -40° \text{ C.})}$$

The lower extreme value $|0.16V|$ of the range of variation of the threshold voltage is yet sufficiently high to ensure a cut-off condition of the protection MOS transistor also at high temperature, when the integrated circuit is normally working (VBB=$-$5V, VCC=$+$5V). If this condition were not satisfied, a permanent current path may form from the common potential node VBB and ground (or VCC and ground in the case of N-Well devices), which could depress the low dissipation characteristics of the integrated circuit, particularly under stand-by or power down conditions.

The upper extreme of the variation range of the threshold voltage becomes important when the protection transistor is conducting and must prevent direct biasing of the internal junctions of the integrated circuit. The extreme value of $|0.710V|$ should not alarm because also the VBE voltage will be similarly increased along with the drop of the temperature and, even if:

$$|VBE| < |0.710V|$$

it should be noted that at low temperature, the current that must be injected in a direct biased junction in order to trigger latch-up increases greatly because of the reduction (along with the low temperature) of the current gain ($\beta$) of the parasitic bipolar transistors.

DIMENSIONING OF THE PROTECTION TRANSISTOR

According to a particularly preferred embodiment of the invention, the length (L) of the protection integrated MOS transistor should be at least twice the minimum length of the particular CMOS fabrication process utilized for fabricating the integrated circuit with the objective of reducing the "below threshold" currents when the protection MOS transistor will result cut-off at a temperature near the maximum contemplated.

The width (W) of the protection integrated transistor, compatibly with the charateristics of the fabrication process used, should preferably be relatively large for reducing as much as possible the series resistance (Ron) of the protection transistor and, in any case, it should be sufficient to permit sending to ground rather large currents without the drain-source voltage (VDS) raising excessively indicatively, the W dimension of the integrated protection transistor should be:

WN=3,000–5,000 micrometers in the case of a P-Well CMOS device, while in the case of a N-Well CMOS device
WP=15,000–15,000 micrometers.

Even such rather large dimensions of the integrated protection transistor are not particularly burdensome in respect to the overall economy of the integrated circuit produced, being necessary just a single protection transis tor for the entire integrated circuit.

The two supplies CMOS integrated circuit provided with the protection device of the present invention offers remarkable advantages in respect of the known solutions of the problem of controlling latch-up in such a family of integrated circuits. By means of a single additional integrated protection MOS transistor, latch-up problems are effectively prevented in a chip, independently from what takes place outside the integrated circuit. Construction restraints of cards carrying such integrated circuits and by-pass capacitors are advantageously eliminated. Further eliminated is the necessity of employing additional external components such as Schottky diodes, which reduces reliability of the card itself. Moreover, with increasing utilization of P-Well and N-Well CMOS integrated devices in the same system, housing both kinds of devices on a same system's card will be readily possible without encountering particular problems relative to ensure a proper insertion - extraction sequence of the supply track's terminals, upon card transfer.

What is claim is:

1. A two-power-supply CMOS integrated circuit having a positive, a negative and a ground supply rails and a well region of a first polarity; MOS transistors having a channel of a second polarity being formed within said well region and complementary MOS transistors having a channel of said first polarity being formed outside said well region; the integrated circuit having means for preventing latch-up when said well region is accidentally floated comprising at least an integrated MOS transistor having a channel of said second polarity and having a source, a drain and a body region and a gate terminal; said drain and said body regions being electrically connected in common with said gate terminal to the supply rail of said second polarity and said source region being electrically connected to ground; said integrated transistor being in a turn-off condition under correct supply conditions and functioning in a turn-on saturated condition when limiting the potential excursion of an accidentally floated well region.

2. The integrated circuit of claim 1, wherein the channel length of said integrated MOS transistor is at least twice an unitary minimum channel length of transistors forming said integrated circuit.

3. The integrated circuit of claim 2, wherein said well region is a P-type region, said integrated MOS transistor has an N-type channel with a width comprised between 3,000 and 5,000 micrometers.

4. The integrated circuit of claim 2 wherein said well region is an N-type region, said integrated MOS transistor has a P-type channel with a width comprised between 10,000 and 15,000 micrometers.

* * * * *